(12) United States Patent
Shiino et al.

(10) Patent No.: US 8,848,447 B2
(45) Date of Patent: Sep. 30, 2014

(54) NONVOLATILE SEMICONDUCTOR MEMORY DEVICE USING WRITE PULSES WITH DIFFERENT VOLTAGE GRADIENTS

(75) Inventors: Yasuhiro Shiino, Yokohama (JP); Daisuke Kouno, Yokkaichi (JP); Shigefumi Irieda, Yokohama (JP); Kenri Nakai, Fujisawa (JP); Eietsu Takahashi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 452 days.

(21) Appl. No.: 13/226,826

(22) Filed: Sep. 7, 2011

(65) Prior Publication Data

US 2012/0072648 A1    Mar. 22, 2012

(30) Foreign Application Priority Data

Sep. 22, 2010   (JP) ................................. 2010-211864

(51) Int. Cl.
| | | |
|---|---|---|
| *G11C 11/34* | (2006.01) | |
| *G11C 16/04* | (2006.01) | |
| *G11C 16/10* | (2006.01) | |
| *G11C 16/34* | (2006.01) | |

(52) U.S. Cl.
CPC ............ *G11C 16/0483* (2013.01); *G11C 16/10* (2013.01); *G11C 16/3459* (2013.01)
USPC .................................................... 365/185.19

(58) Field of Classification Search
USPC ............................ 365/185.18, 185.19, 185.22
See application file for complete search history.

(56) References Cited

U.S. PATENT DOCUMENTS

| | | | |
|---|---|---|---|
| 6,166,962 A | 12/2000 | Chen et al. | |
| 6,188,611 B1 * | 2/2001 | Endoh et al. | ............. 365/185.24 |
| 6,791,884 B2 | 9/2004 | Matsuda et al. | |
| 6,894,931 B2 | 5/2005 | Yaegashi et al. | |
| 7,057,931 B2 | 6/2006 | Lutze et al. | |
| 7,057,936 B2 * | 6/2006 | Yaegashi et al. | ......... 365/185.22 |

(Continued)

FOREIGN PATENT DOCUMENTS

WO    WO 02/19342 A1    3/2002

OTHER PUBLICATIONS

U.S. Appl. No. 13/413,067, filed Mar. 6, 2012, Shiino, et al.

(Continued)

*Primary Examiner* — Kretelia Graham
(74) *Attorney, Agent, or Firm* — Oblon, Spivak, McClelland, Maier & Neustadt, L.L.P.

(57) ABSTRACT

A nonvolatile semiconductor memory device in accordance with an embodiment includes: a memory cell array having electrically rewritable nonvolatile memory cells; and a control unit. The control unit performs control of repeating a write operation, a write verify operation, and a step-up operation, the write verify operation being an operation to verify whether data write is completed or not, and the step-up operation being an operation to raise the write pulse voltage if data write is not completed. The control unit, during the write operation, raises a first write pulse voltage with a first gradient, and then raises a second write pulse voltage with a second gradient, thereby executing the write operation, the first write pulse voltage including at least a write pulse voltage generated at first, the second write pulse voltage being generated after the first write pulse voltage, and the second gradient being larger than the first gradient.

18 Claims, 8 Drawing Sheets

(56) References Cited

U.S. PATENT DOCUMENTS

| | | | | |
|---|---|---|---|---|
| 7,633,804 | B2* | 12/2009 | Nobunaga | 365/185.19 |
| 7,839,690 | B2* | 11/2010 | Lee et al. | 365/185.18 |
| 7,889,562 | B2* | 2/2011 | Nobunaga | 365/185.19 |
| 8,134,871 | B2* | 3/2012 | Dutta et al. | 365/185.06 |
| 8,472,257 | B2* | 6/2013 | Dong et al. | 365/185.19 |
| 2004/0057288 | A1* | 3/2004 | Kawabata | 365/185.29 |
| 2008/0019180 | A1* | 1/2008 | Wan et al. | 365/185.17 |
| 2011/0007572 | A1* | 1/2011 | Ueno et al. | 365/185.22 |
| 2011/0013461 | A1* | 1/2011 | Shiino et al. | 365/185.22 |

OTHER PUBLICATIONS

G.J. Hemink, et al., "Fast and Accurate Programming Method for Multi-Level NAND EEPROMs", VLSI Technology Digest of Technical Papers, Jun. 1995, pp. 129-130.

Kang-Deog Suh, et al., "A 3.3 V 32 Mb NAND Flash Memory with Incremental Step Pulse Programming Scheme", Solid-State Circuits Conference Digest of Technical Papers, Feb. 1995, pp. 128-129.

U.S. Appl. No. 13/288,485, filed Nov. 3, 2011, Sakaniwa, et al.

U.S. Appl. No. 13/308,376, filed Dec. 1, 2011, Sakaniwa, et al.

* cited by examiner

FIG. 2
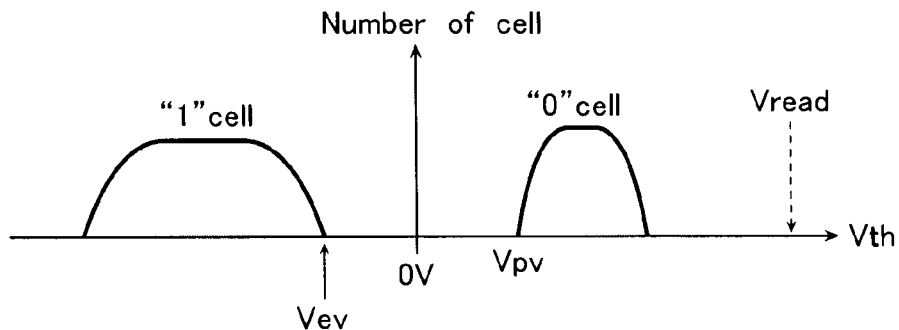
FIG. 3 ("0" Write Operation)
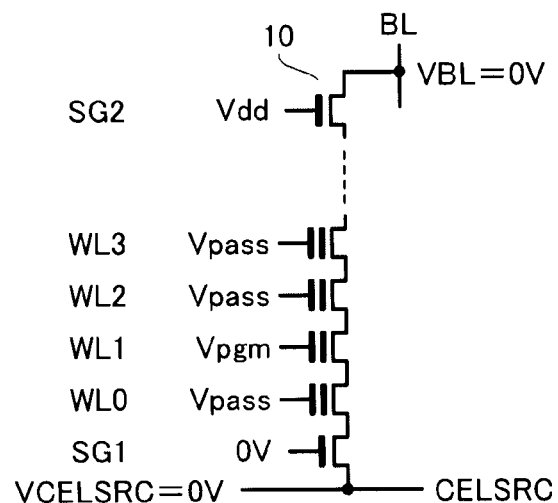
FIG. 4 (Write Verify)
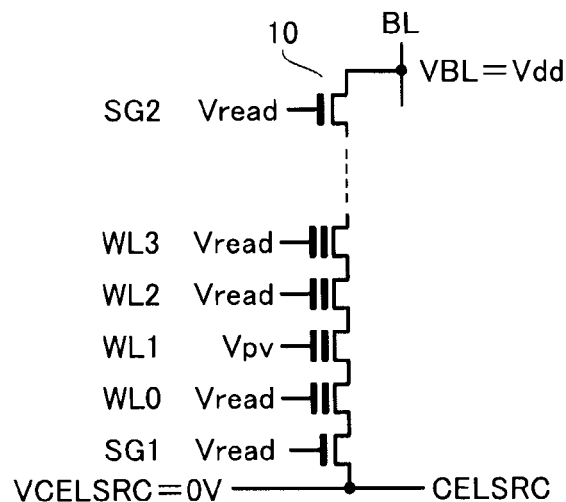

FIG. 7
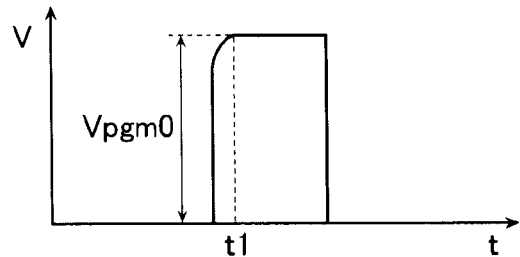
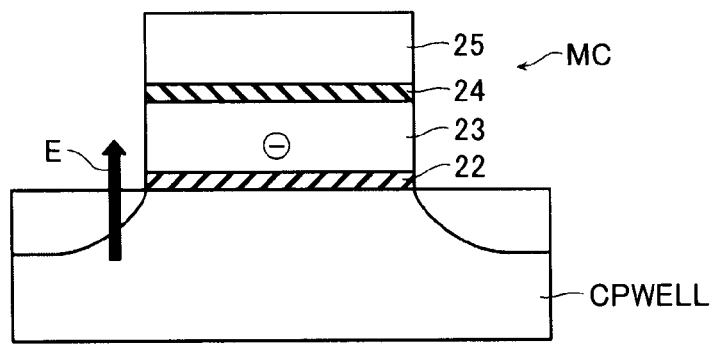
FIG. 8
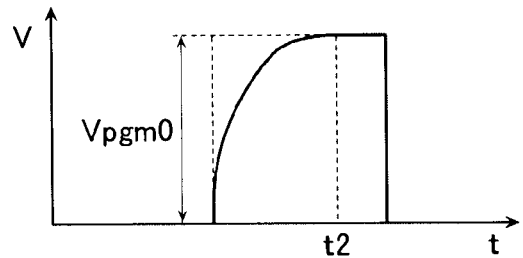
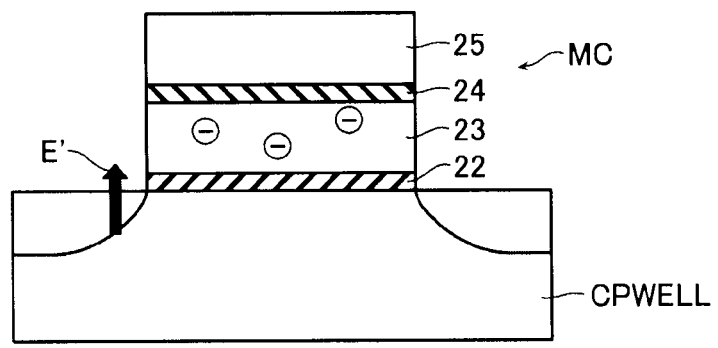

NONVOLATILE SEMICONDUCTOR MEMORY DEVICE USING WRITE PULSES WITH DIFFERENT VOLTAGE GRADIENTS

CROSS REFERENCE TO RELATED APPLICATIONS

This application is based upon and claims the benefit of priority from prior Japanese Patent Application No. 2010-211864, filed on Sep. 22, 2010, the entire contents of which are incorporated herein by reference.

BACKGROUND

1. Field

Embodiments described in the present specification relate to an electrically rewritable nonvolatile semiconductor memory device.

2. Description of the Related Art

A memory cell array in a NAND-type flash memory is configured as an arrangement of NAND cell units, each of the NAND cell units having a plurality of memory cells connected in series. Both ends of a NAND cell unit are connected to a bit line and a source line, respectively, via select gate transistors. The control gate electrodes of memory cells in each NAND cell unit are connected to different word lines. In each NAND cell unit, a plurality of memory cells are connected in series, sharing a source and a drain with one another. In NAND-type flash memory, these memory cells share select gate transistors, associated bit-line or source-line contacts, and so on. This can reduce the size of a unit memory cell. Furthermore, device regions for word lines, memory cells, and so on, in the NAND-type flash memory are configured close to a simple stripe pattern. This is suitable for shrinking and allows large capacity flash memory to be realized.

In NAND-type flash memory, data write and erase are performed by causing FN tunnel current to flow through many cells at the same time. Specifically, data write is performed on a page basis, where a set of memory cells sharing one word line represents one page. After a data write operation, a verify read (write verify) operation is performed to verify whether data is accurately written to the memory cells or not. As a result of the write verify operation, if it is determined that data is not written to the memory cells satisfactorily, then similar write operations and write verify operations are repeated, raising a write pulse voltage in stages (step-up).

In addition, data erase in NAND-type flash memory is performed on a block basis, where a block is defined as a set of NAND cell units sharing word lines and select gate lines. In addition, when data erase is performed in blocks in the NAND-type flash memory, a verify read (erase verify) operation is performed to verify whether a memory cell reaches an erase state or not, that is, whether a threshold voltage of the memory cell falls within a certain value or not. As a result of the erase verify operation, if it is determined that erase is not performed satisfactorily, then similar erase operations and erase verify operations are repeated, raising an erase voltage in stages (step-up).

Incidentally, when the write/erase operations are repeatedly performed on one memory cell, a tunnel insulating film in the memory cell gradually degrades, resulting in a drop in reliability of the NAND-type flash memory. Therefore, stress on memory cells due to write and erase voltages should preferably be reduced as much as possible. Reducing stress on the memory cells improves reliability of the NAND-type flash memory and contributes to a longer lifetime of the memory cells.

BRIEF DESCRIPTION OF THE DRAWINGS

FIG. 2 is a view showing a relationship between data to be stored in a memory cell and threshold voltage.

FIG. 3 is a view explaining voltages applied to a NAND cell unit during a write operation.

FIG. 4 is a view explaining voltages applied to a NAND cell unit during a write verify operation.

FIG. 7 is a schematic view explaining advantages of the nonvolatile semiconductor memory device in accordance with the first embodiment.

FIG. 8 is a schematic view explaining advantages of the nonvolatile semiconductor memory device in accordance with the first embodiment.

DETAILED DESCRIPTION

A nonvolatile semiconductor memory device in accordance with an embodiment comprises: a memory cell array having electrically rewritable nonvolatile memory cells arranged therein; and a control unit. The control unit performs control of repeating a write operation, a write verify operation, and a step-up operation, the write operation being an operation to apply a write pulse voltage to a selected one of the memory cells for data write, the write verify operation being an operation to verify whether data write is completed or not, and the step-up operation being an operation to raise the write pulse voltage by an amount of a certain step-up voltage if data write is not completed. The control unit, during the write operation, raises a first write pulse voltage with a first gradient, and then raises a second write pulse voltage with a second gradient, thereby executing the write operation, the first write pulse voltage including at least a write pulse voltage generated at first, the second write pulse voltage being generated after the first write pulse voltage, and the second gradient being larger than the first gradient.

Next, embodiments of the present invention are described in detail with reference to the drawings.

First Embodiment

Figure 1:
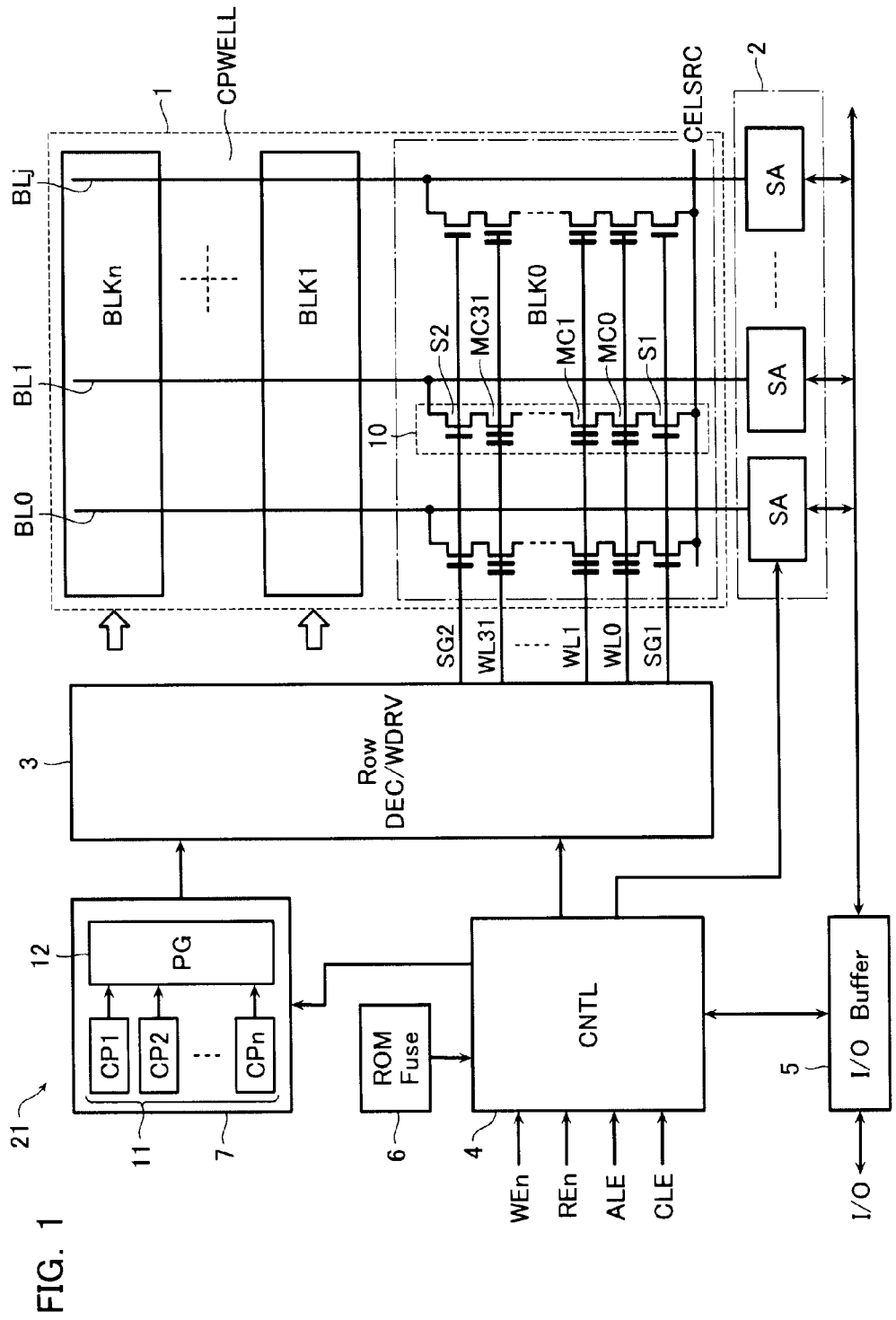
FIG. 1 is a view showing a schematic configuration of a nonvolatile semiconductor memory device in accordance with a first embodiment of the present invention.

FIG. 1 is a view showing a schematic configuration of a nonvolatile semiconductor memory device in accordance with a first embodiment of the present invention. As shown in FIG. 1, a NAND-type flash memory 21 includes a memory cell array 1, a sense amplifier circuit 2, a row decoder 3, a controller 4, an input/output buffer 5, a ROM fuse 6, and a voltage generating circuit 7. The controller 4 configures a control unit for the memory cell array 1.

The memory cell array 1 has NAND cell units 10 arranged in a matrix. One NAND cell unit 10 is configured by a plurality of memory cells MC (MC0, MC1, . . . , MC31) connected in series and select gate transistors S1 and S2 connected to each end thereof.

Although not shown, one memory cell MC may have a stacked gate-type structure, which is well-known in the art. That is, the memory cell MC may include: a floating gate electrode which acts as a charge storage layer and is formed on a gate insulating film (tunnel insulating film) formed between the drain and the source of the memory cell MC; and a control gate electrode which is formed on the floating gate electrode via an intergate insulating film. The memory cells MC in each NAND cell unit 10 have their control gate electrodes connected to different word lines WL (WL0, WL1, . . . , WL31), respectively.

The select gate transistors S1 have their sources connected to a common source line CELSRC, and the select gate transistors S2 have their drains connected to bit lines BL. The select gate transistors S1 and S2 have their gates connected to, respectively, select gate lines SG1 and SG2 parallel to the word lines WL. A set of memory cells MC sharing one word line configures one page. When the memory cells MC store multilevel data or when control is performed to alternately select either even-numbered or odd-numbered bit lines, a set of memory cells MC sharing one word line configures multiple pages of two pages or more.

As shown in FIG. 1, a set of multiple NAND cell units 10 sharing word lines WL and select gate lines SG1 and SG2 configures a block BL which is a unit of data erase. The memory cell array 1 has a plurality of blocks BLK (BLK0, BLK1, . . . , BLKn) in a bit line BL direction. The memory cell array 1 including these multiple blocks is formed in one cell well (CPWELL) of a silicon substrate.

The bit lines BL of the memory cell array 1 are connected to the sense amplifier circuit 2 that includes a plurality of sense amplifiers SA. The sense amplifiers SA configure a page buffer for sensing read data and retaining write data. The sense amplifier circuit 2 includes column select gates. The row decoder (including a word-line driver WDRV) 3 selects and drives the word lines WL and select gate lines SG1 and SG2.

The data input/output buffer 5 transmits and receives data between the sense amplifier circuit 2 and an external input/output terminal, and receives other data such as command data or address data. The controller 4 controls the entire memory operation in response to external control signals, such as write enable signals WEn, read enable signals REn, address latch enable signals ALE, or command latch enable signals CLE.

Specifically, the controller 4 includes a command interface as well as address latch and transfer circuits, and determines whether supplied data is write data or address data. Depending on the results of this determination, write data is transferred to the sense amplifier circuit 2, and address data is transferred to the row decoder 3 and the sense amplifier circuit 2. The controller 4 also performs sequence control of read, write, or erase operations, control of applied voltage, and so on, based on external control signals.

The voltage generating circuit 7 comprises a boost circuit 11 and a pulse generating circuit 12. The boost circuit 11 may be configured from a plurality of charge pump circuits CP (CP1, CP2, . . . , CPn), which are well-known in the art. The voltage generating circuit 7 changes the number of driven charge pump circuits CP based on control signals from the controller 4, and further controls the pulse generating circuit 12 to generate a preferable pulse voltage. The number of driven charge pump circuits CP is changed for the purpose of changing the rise time of the pulse voltage (the degree of waveform bluntness), which will be described later.

FIG. 2 is a view showing a relationship between data to be stored in a memory cell MC and threshold voltage. When one memory cell MC stores one bit, a memory cell MC with a negative threshold voltage is defined as a "1" cell that retains logical "1" data, and a memory cell MC with a positive threshold voltage is defined as a "0" cell that retains logical "0" data. An operation setting a memory cell MC to a "1" data state is assumed to be an erase operation, and an operation setting a memory cell MC to a "0" data state is assumed to be a write operation.

[Erase Operation]

In NAND-type flash memory, a data erase operation is normally performed on a block basis. In the data erase operation, an erase pulse voltage Vera (of the order of 10 V to 30 V) is applied to the cell well (CPWELL), and 0 V is applied to all of the word lines WL in a selected block. As a result, charge is extracted from the floating gate electrodes of respective memory cells MC to the cell well by FN tunnel current, thereby reducing the threshold voltages of the memory cells MC. At this time, the select gate lines SG1 and SG2 are set to floating states to avoid breakdown of the gate oxide films of the select gate transistors S1 and S2.

The bit line BL and the source line CELSRC are also set to floating states. Note that the erase operation is executed again according to the results of an erase verify operation performed after the erase operation. When the erase operation is re-performed, the erase pulse voltage Vera is stepped up in increments of a voltage ΔV, and the erase operation executed using the stepped-up voltage Vera+ΔV.

[Write Operation]

FIG. 3 is a view explaining voltages applied to a NAND cell unit during a write operation. The write operation is executed on a page basis. During the write operation, a write pulse voltage Vpgm (about 10 V to 25 V) is applied to a selected word line (WL1) in a selected block. In addition, a write intermediate voltage Vpass (about 5 V to 15 V) is applied to unselected word lines (WL0, WL2, WL3, . . . ), and a voltage Vdd is applied to the select gate line SG2.

Prior to this write operation, the bit line BL and the NAND cell unit 10 are precharged according to the write data. Specifically, when writing "0" data, 0 V is applied to the bit line BL from the sense amplifier circuit 2. This voltage of the bit line is transferred to the channel of the memory cell MC connected to the selected word line WL1, via the select gate transistor S2 and unselected memory cells MC. Accordingly, under the above-mentioned write operation conditions, charge is injected into the floating gate electrode from the channel of the selected memory cell MC, and the threshold voltage of the memory cell MC shifts to positive (which provides a "0" cell).

When writing "1" (i.e., in the case that "0" data is not written to the selected memory cell MC; write inhibit), the voltage Vdd is applied to the bit line BL. This voltage Vdd of the bit line is reduced by an amount of the threshold voltage of the select gate transistor S2 and transferred to the channel of the NAND cell unit, and then the channel is set to a floating state. Thus, when the above-mentioned write pulse voltage Vpgm or intermediate voltage Vpass is applied, the channel voltage rises due to capacitance coupling, with the result that charge is not injected into the floating gate electrode. Accordingly, the memory cell MC retains "1" data.

Similarly to the erase operation, the write operation is executed again according to the results of a write verify operation to be described later. When the write operation is re-performed, the write pulse voltage Vpgm is stepped up in increments of a voltage ΔV, and the write operation executed using the stepped-up voltage Vpgm+ΔV. In addition, it is assumed that at least an initially applied write pulse voltage Vpgm0 has a rise time longer than that of the subsequently applied write pulse voltage Vpgm, having, as it were, a blunted waveform. The waveform of the write pulse voltage Vpgm is described in detail later.

[Read Operation]

Ina data read operation, a read voltage 0 V is applied to a word line WL (selected word line WL1) to which a selected memory cell MC in the NAND cell unit 10 is connected. In addition, a read pass voltage Vread (of the order of about 3 V to 8 V) is applied to the word lines WL (unselected word lines WL0, WL2, WL3, ...) to which unselected memory cells MC are connected. At this time, the sense amplifier circuit 2 detects whether current flows through the NAND cell unit 10 or not, to determine what data is stored therein.

[Write Verify Operation]

During data read, a margin is required between a set threshold voltage state and the read voltage 0 V for ensuring data reliability. Therefore, in the data erase and write operations, it becomes necessary for a lower limit value Vpv of the threshold voltage distribution of "0" data and an upper limit value Vev of the threshold voltage distribution of "1" data to be controlled to have an appropriate margin with the voltage 0 V (refer to FIG. 2).

Thus, after the write pulse voltage Vpgm is applied in the previously-mentioned write operation, a verify read (write verify) operation is performed to verify that a lower limit of the threshold voltage distribution of the selected memory cells MC of "0" data is not less than the lower limit value Vpv. In the case of the erase operation, after an erase pulse voltage is applied by the operation as mentioned above, a verify read (erase verify) operation is performed to verify that an upper limit of the threshold voltage distribution of the erase memory cells is not more than the upper limit value Vev of the threshold voltage distribution.

FIG. 4 is a view explaining voltages applied to the NAND cell unit 10 during a write verify operation. The write verify operation is substantially similar to the above-mentioned read operation. That is, the read pass voltage Vread (of the order of about 3 V to 8 V) is applied to the word lines WL (unselected word lines WL0, WL2, WL3, ...) to which unselected memory cells MC are connected and to the select gate lines SG1 and SG2. In addition, the voltage Vdd is applied to the bit line BL, and 0 V is applied to the common source line CELSRC. Now, a write verify voltage Vpv is applied to the word line WL (selected word line WL1) to which the selected memory cell MC is connected. At this time, the sense amplifier circuit 2 detects whether current flows through the NAND cell unit 10 or not, to determine what data is stored therein.

If the selected memory cell MC has "0" data written thereto, current does not flow in the NAND cell unit 10, even if the above-mentioned write verify operation is performed. On the other hand, when the threshold voltage of the selected memory cell MC does not reach the threshold voltage distribution of "0" data, current flows in the NAND cell unit 10. If it is detected that the selected memory cell MC has "0" data written thereto, then it is considered that the selected memory cell MC is sufficiently written, in which case the write operation terminates. If the selected memory cell MC does not have "0" data written thereto, then the write operation is performed again on the selected memory cell MC.

[Step-Up Operation]

Figure 5:
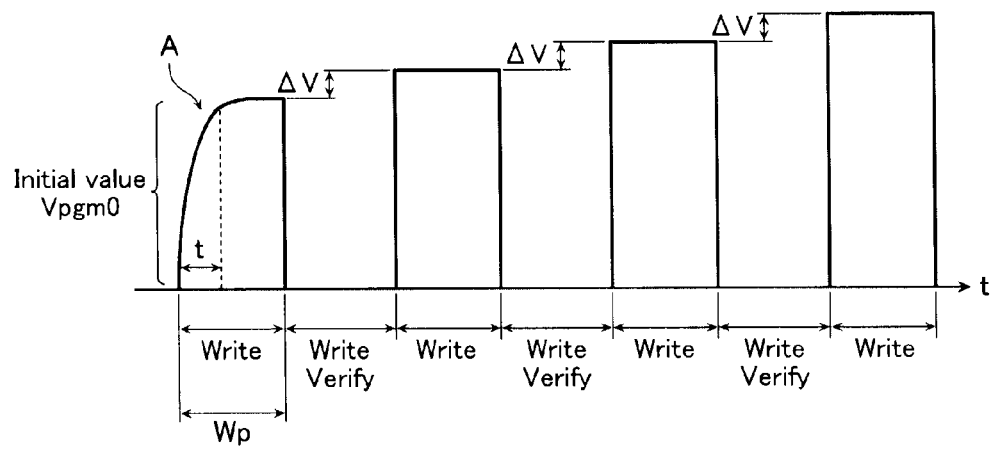
FIG. 5 is a view showing how a write pulse voltage Vpgm is stepped up when a write operation is re-performed after a write verify operation.

FIG. 5 is a view showing how the write pulse voltage Vpgm is stepped up when the write operation is re-performed after the write verify operation. When the write operation is performed again, the write pulse voltage Vpgm is set to a voltage (Vpgm0+ΔV) which is larger than an initial value Vpgm0 by a step-up value ΔV (>0) (refer to FIG. 5). If there still remains any memory cell MC that is not sufficiently written even by the re-set large write pulse voltage Vpgm=Vpgm0+ΔV, then a further step-up operation is performed to increase the write pulse voltage by a step-up value ΔV (set Vpgm=Vpgm0+2ΔV). The write, write verify, and step-up operations are then repeated until the data write is completed. The write pulse voltage Vpgm steps up by ΔV for each repetition. Note that the step-up width may be of any value that makes the write pulse voltage Vpgm larger than the previous write pulse voltage, and is not limited to equal values of ΔV.

[Control of Rise Time of Write Pulse Voltage]

As described above, the write pulse voltage Vpgm is stepped up by a voltage ΔV according to the results of the write verify operation. It is also assumed that, as shown in FIG. 5, at least an initially applied write pulse voltage Vpgm0 has a rise time longer than that of the subsequently applied write pulse voltage Vpgm, having, as it were, a blunted waveform (as indicated by label A in FIG. 5). As previously mentioned, the boost circuit 11 in the voltage generating circuit 7 includes a plurality of (for example, N) charge pump circuits CP1, CP2, .... The rise time of the boost pulse voltage Vpgm (gradient of the voltage change curve) can be changed by increasing the number of driven charge pump circuits CP. For example, as indicated by A to D in FIG. 6, four different rise times of the boost pulse voltage Vpgm (gradients of the voltage change curve) can be selected.

For example, at normal times, a large number of (for example, L (N≥L)) charge pump circuits CP are driven for selection of waveform D. On the other hand, when applying the initially applied write pulse voltage Vpgm0, a smaller number of (for example, M (N≥L>M)) charge pump circuits CP than at normal times may be driven to select waveform A. This enables the rising edge of the waveform of the write pulse voltage Vpgm0 to be blunted, with the result that stress on the tunnel insulating film of the memory cells MC is reduced. This reduction in stress is described referring to FIGS. 7 and 8.

FIGS. 7 and 8 are each schematic views showing a difference in effects on a memory cell MC for different rise times (different slopes of the voltage change curve) of the write pulse voltage Vpgm0 initially applied in a write operation. FIGS. 7 and 8 show cross-sectional views of the memory cell MC schematically. The memory cell MC includes the cell well CPWELL, a tunnel insulating film 22, a floating gate electrode 23, an intergate insulating film 24, and a control gate electrode 25.

As shown in FIG. 7, when the rise time to the voltage value Vpgm0 is extremely short, almost no charge is stored in the floating gate electrode 23 at time t1 when the voltage value Vpgm0 is reached. Therefore, a large electric field is generated at the tunnel insulating film 22 between the cell well CPWELL and the floating gate electrode 23. In contrast, as shown in FIG. 8, when the rise time to the voltage value Vpgm0 is long, charge is gradually stored in the floating gate electrode 23 during the process of rising. At time t2 when the voltage value Vpgm0 is reached, a larger amount of charge is stored in the floating gate electrode 23 than in the example of FIG. 7. Accordingly, the electric field generated at the tunnel insulating film 22 between the cell well CPWELL and the floating gate electrode 23 may be reduced as compared with the case of FIG. 7.

As described above, in the present embodiment, the rise time of the write pulse voltage Vpgm0 initially applied in a write operation is set longer than that of the subsequently applied write pulse voltage Vpgm. If a write pulse voltage Vpgm with a short rise time is used during an initial stage of the write operation when little charge is stored to the floating gate electrode 23, stress on the tunnel insulating film 22 of the memory cells MC is increased, leading to accelerated degradation of the memory cells MC. A drop in reliability of the memory cells MC increases the proportion of memory cells MC that are susceptible to be changed from "1" data to "0" data (easily written), which raises erroneous writes. Stress on the tunnel insulating film 22 of the memory cells MC may be reduced using a write pulse voltage with a long rise time and a blunted waveform as shown in FIG. 8.

Note that, as shown in FIG. 5, in terms of stress reduction, it is preferable that a relation of Wp/3≤t be satisfied, where Wp is a pulse width of the initially applied write pulse voltage Vpgm0, and t is a width of a portion of the rise curve of the write pulse voltage Vpgm0 up to a certain value (saturation value) of the write pulse voltage Vpgm0. Now, the voltage following the portion of the rise curve of width t may be constant or may rise gradually (to a saturation state). Applying a write pulse voltage satisfying the above expression allows the upper limit of the threshold distribution of a "1" cell to be lowered after repetitions of write/erase. That is, erroneous write from "1" data to "0" data can be prevented.

In the write operations subsequent to the one in which a large amount of charge is injected into the floating gate electrode 23 due to the initially applied write pulse voltage Vpgm0, an ordinary write pulse voltage (voltage Vpgm0+ n·ΔV) with a short rise time is preferably employed (refer to FIG. 5). That is, preferably, all of the charge pump circuits CP in the voltage generating circuit 7 are driven to generate the write pulse voltage. This is because, if a large amount of charge is stored, then even if an ordinary write pulse voltage with a short rise time is employed, the electric field generated in the tunnel insulating film 22 does not increase, and a large stress does not occur. Rather, using a write pulse voltage with a short rise time leads to a reduction in write time.

Note that, how many of the charge pump circuits CP are to be driven when applying the initial write pulse voltage Vpgm0 of the write operation may be stored as voltage setting data in, for example, the ROM fuse 6 shown in FIG. 1. The controller 4 can set the number of charge pump circuits CP to be driven, according to this voltage setting data.

Second Embodiment

Next, a second embodiment of the present invention is described with reference to FIG. 9. This embodiment differs from the first embodiment in using a blunted waveform not only when the initial write pulse voltage Vpgm0 is applied, but also when a second write pulse voltage Vpgm0+ΔV is applied (label B in FIG. 9). Increasing the number of write pulse voltages having a blunted waveform in this manner allows stress on the tunnel insulating film in the memory cells MC to be reduced even more.

Now, a different number of charge pump circuits CP may be driven in the cases of the initial write pulse voltage Vpgm0 and the second write pulse voltage Vpgm0+ΔV. For example, pulse voltages may be generated driving two charge pump circuits CP for the initial write pulse voltage Vpgm0 and driving four charge pump circuits CP for the second write pulse voltage Vpgm0+ΔV. This allows the initial write pulse voltage Vpgm0 to be configured as waveform A shown in FIG. 6, and the second write pulse voltage Vpgm0+ΔV to be configured as waveform B in FIG. 6.

Figure 6:
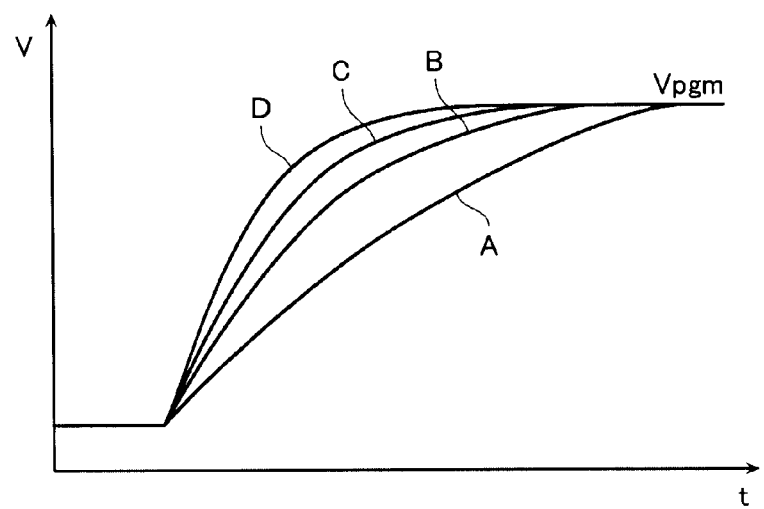
FIG. 6 is a graph explaining how a rise time of a write pulse voltage Vpgm (gradient of a voltage change curve) is changed.
Figure 9:
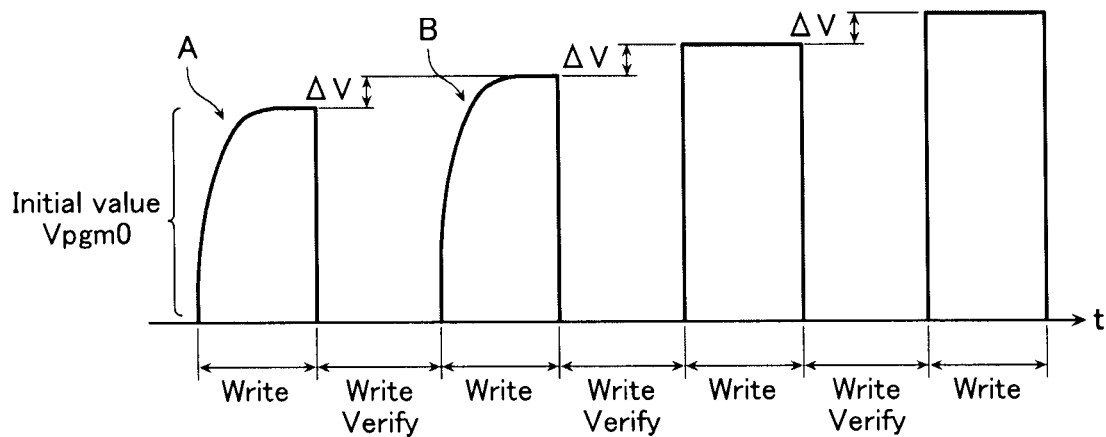
FIG. 9 is a view showing operation of a nonvolatile semiconductor memory device in accordance with a second embodiment of the present invention.

While FIG. 9 describes a case where the number of write pulse voltages having a blunted waveform is two, the present invention is not so limited and may include a larger number of write pulse voltages Vpgm having a blunted waveform. This number may be specified according to control data stored in the ROM fuse 6 as mentioned above. Alternatively, the controller 4 may store data, such as the number of write/erase times to a specific block BLK, the number of loops (the number of step-ups) in a write operation, or the number of loops (the number of step-ups) in an erase operation. Based on this data, the controller 4 may control, as appropriate, the number of write pulse voltages Vpgm having a blunted waveform. In addition, the controller 4 may control, as appropriate, which of waveforms A to D shown in FIG. 6 is to be set as the waveform of the write pulse voltage Vpgm that is to be applied multiple times. In this case, the write pulse voltage Vpgm is set such that the rising edge of its waveform becomes steeper as the number of write pulse voltages Vpgm increases.

Third Embodiment

Figure 10A:
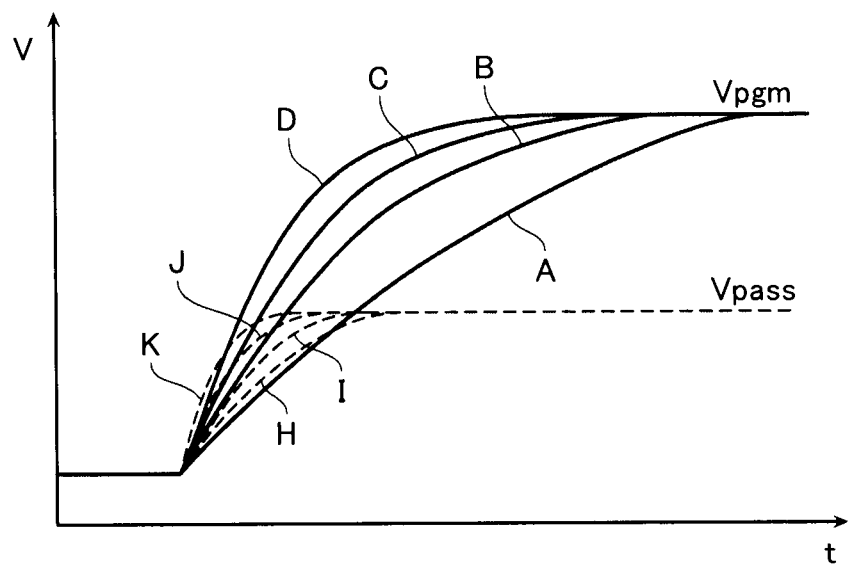
FIG. 10A is a view showing operation of a nonvolatile semiconductor memory device in accordance with a third embodiment of the present invention.
Figure 10B:
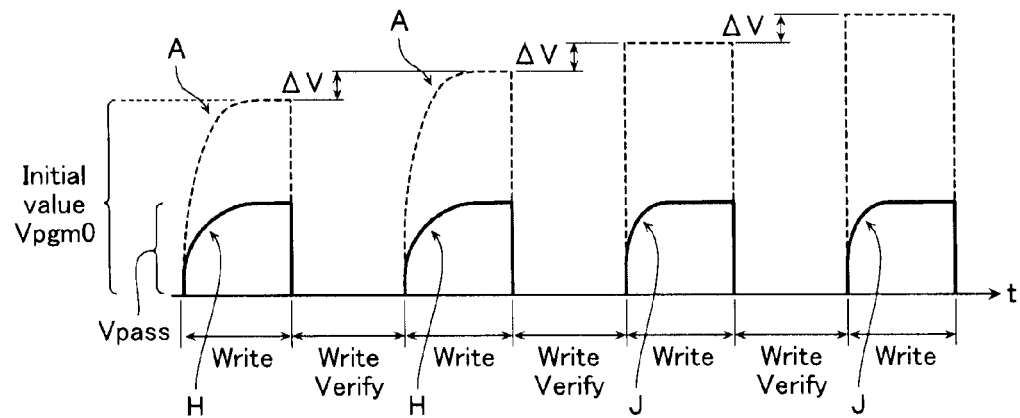
FIG. 10B is a view showing operation of the nonvolatile semiconductor memory device in accordance with the third embodiment of the present invention.
Figure 10C:
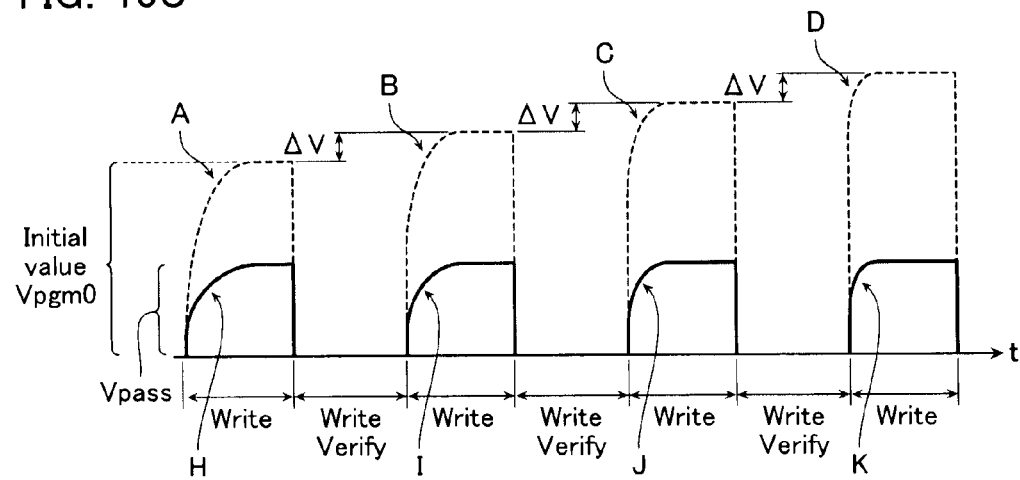
FIG. 10C is a view showing operation of the nonvolatile semiconductor memory device in accordance with the third embodiment of the present invention.

Next, a third embodiment of the present invention is described with reference to FIGS. 10A, 10B and 10C. This embodiment differs from the first embodiment in using a blunted waveform in the intermediate voltage Vpass applied to unselected memory cells MC during the write operation, as well as in the write pulse voltage Vpgm. For example, as shown by the broken lines in FIG. 10A, four different rise times (gradients of the voltage change curve) may be selected as rise times of the intermediate voltage Vpass (refer to labels H to K). As previously mentioned, the rise time of the intermediate voltage may be controlled by increasing the number of driven charge pump circuits CP.

The rise waveform of the intermediate voltage Vpass (shown by the solid lines in FIG. 10B) may be selected based on the number of write pulse voltages. For example, as shown in FIG. 10B, the waveform having the rising edge indicated by label H may be set when the initial and second write pulse voltages Vpgm (shown by the broken lines in FIG. 10B) are applied, and the waveform having the rising edge indicated by label J may be set when applying write pulse voltages Vpgm subsequent to the initial and second write pulse voltages Vpgm. Moreover, as shown in FIG. 10C, the rise waveform of the intermediate voltage Vpass (shown by the solid lines in FIG. 10C) may also be selected so as to correspond to the rise waveform of the write pulse voltage Vpgm (shown by the broken lines in FIG. 10C). For example, the waveform having the rising edge indicated by label H may be set when the rising edge of the write pulse voltage Vpgm has the waveform indicated by label A; the waveform having the rising edge indicated by label I may be set when the rising edge of the write pulse voltage Vpgm has the waveform indicated by label B; the waveform having the rising edge indicated by label J may be set when the rising edge of the write pulse voltage Vpgm has the waveform indicated by label C; and the waveform having the rising edge indicated by label K may be set when the rising edge of the write pulse voltage Vpgm has the waveform indicated by label D. The rise times (gradients of the voltage change curve) of the write pulse voltage Vpgm and the intermediate voltage Vpass become larger as the number of loops (the number of step-ups) in a write operation is increased. Blunting the rising edge of the waveform of the intermediate voltage Vpass allows stress on the tunnel insulating film of unselected memory cells MC to be reduced, and, moreover, also allows the occurrence of erroneous writes to unselected memory cells MC to be suppressed.

Fourth Embodiment

Next, a fourth embodiment of the present invention is described with reference to FIG. 11. This embodiment differs from the previous embodiments in having a pulse width of a write pulse voltage with a blunted waveform set longer than a pulse width of an ordinary write pulse voltage with no blunted waveform in a write operation. Now, the write pulse voltage shown in FIG. 11 has a blunted waveform at the rising edge, similarly to the above-described embodiments. However, at time t3 the voltage reaches saturation, and the portion following time t3 where the voltage value is constant is lengthened compared to the previous embodiments. That is, the pulse width is lengthened overall by providing blunting of the waveform and setting the portion following time t3 where the voltage is saturated to be long. As a result, the write operation is performed for a certain time at a high voltage, hence completion of the write operation can be accelerated while reducing stress on the tunnel insulating film 22.

Figure 11:
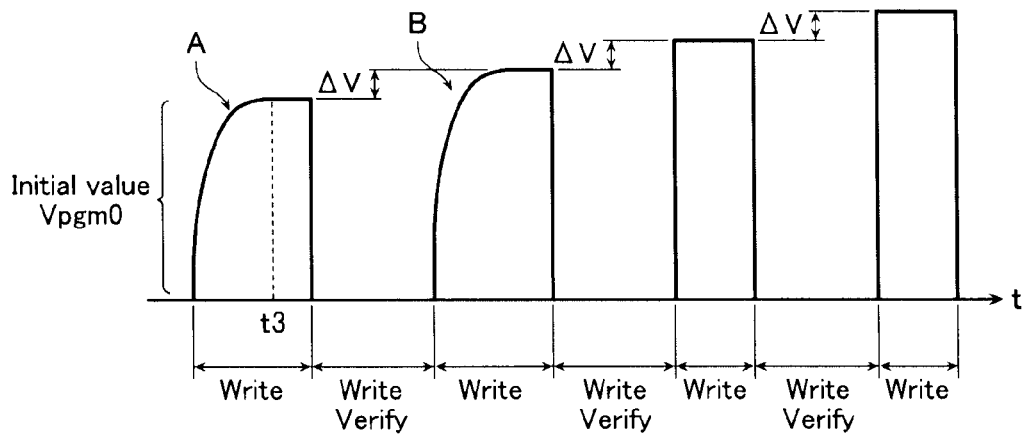
FIG. 11 is a view showing operation of a nonvolatile semiconductor memory device in accordance with a fourth embodiment of the present invention.

In the write operations subsequent to ones in which a large amount of charge is injected into the floating gate electrode 23 due to a certain times of write pulse voltages Vpgm, a write pulse voltage (voltage Vpgm0+n·ΔV) having a short pulse width is preferably employed (refer to FIG. 11). If a large amount of charge is stored, then using a write pulse voltage having a short pulse width leads to a reduction in write time. The pulse width may be specified according to control data stored in the ROM fuse 6 as mentioned above. Alternatively, the controller 4 may store data, such as the number of write/ erase times to a specific block BLK, the number of loops (the number of step-ups) in a write operation, or the number of loops (the number of step-ups) in an erase operation. Based on this data, the controller 4 may control, as appropriate, the pulse width of the write pulse voltages Vpgm having a blunted waveform.

Fifth Embodiment

Next, a fifth embodiment of the present invention is described with reference to FIGS. 12 and 13. This embodiment differs from the previously mentioned embodiments in that the write verify operation subsequent to the write operation using the initial write pulse voltage Vpgm0 is omitted. In the example shown in FIG. 12, after the write operation using the initial write pulse voltage Vpgm0 with a blunted waveform is performed, the next write operation using the stepped-up write pulse voltage Vpgm0+ΔV is executed immediately, without dropping the write pulse voltage. Meanwhile, in the example shown in FIG. 13, after the write operation using the initial write pulse voltage Vpgm0 with a blunted waveform is performed, the write pulse voltage is dropped. However, even in the example of shown in FIG. 13, subsequent to the write pulse voltage being dropped, the next write operation using the stepped-up write pulse voltage Vpgm0+ΔV is executed, without a write verify operation being executed. The chance of write being completed by only the first write pulse voltage Vpgm0 is small. Hence, the subsequent write verify operation is omitted, thereby achieving a reduction in write time.

Figure 12:
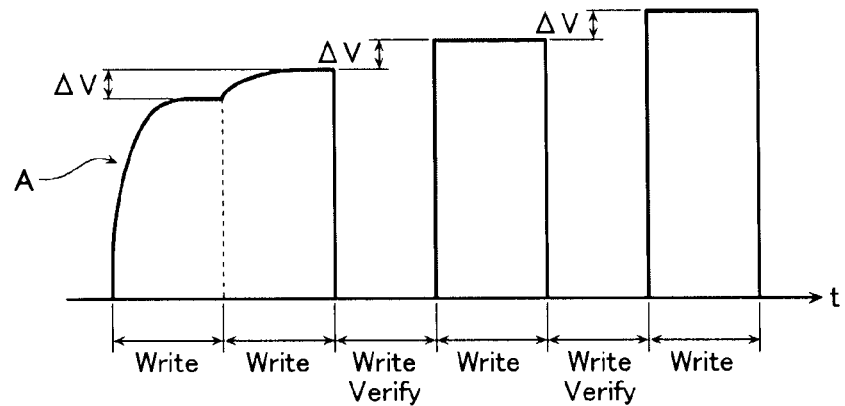
FIG. 12 is a view showing operation of a nonvolatile semiconductor memory device in accordance with a fifth embodiment of the present invention.
Figure 13:
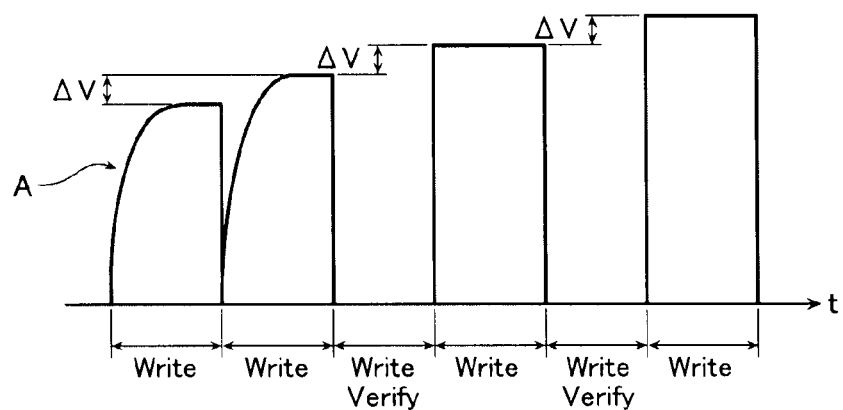
FIG. 13 is a view showing operation of the nonvolatile semiconductor memory device in accordance with the fifth embodiment of the present invention.

Note that, as shown in FIGS. 12 and 13, the stepped-up write pulse voltage Vpgm0+ΔV may also have blunted waveform. Such a waveform can be easily generated by appropriately combining a plurality of charge pump circuits CP.

Sixth Embodiment

Figure 14:
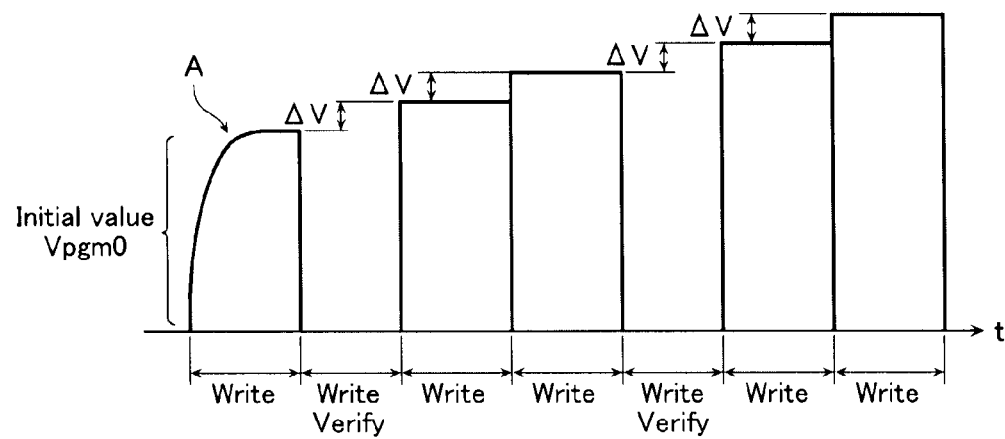
FIG. 14 is a view showing operation of a nonvolatile semiconductor memory device in accordance with a sixth embodiment of the present invention.

Next, a sixth embodiment of the present invention is described with reference to FIG. 14. This embodiment differs from the previously mentioned embodiments in that a write verify operation is executed after the write operation using the initial write pulse voltage Vpgm0 with a blunted waveform, and, during application of subsequent ordinary write pulse voltages Vpgm0+n·ΔV, a write verify operation is performed after every other write operation. This also enables write time to be reduced by reducing the time of write verify operations.

[Other]

This concludes description of the embodiments of the present invention, but it should be noted that the present invention is not limited to the above-described embodiments, and that various alterations, additions, combinations, and so on, are possible within a range not departing from the scope and spirit of the invention. For example, in the above-described embodiments, the waveforms A to D shown in FIG. 6 are described as being obtainable by changing the number of operated charge pump circuits according to the rising edge of the waveform. However, the waveforms A to D of the write pulse voltages may also be obtained by changing the waveform of the clock pulse CLK applied to the charge pump circuits CP as in FIG. 15.

First, when obtaining waveforms such as waveforms A and B which have a blunted rising edge, a clock pulse CLK_1 having a waveform with a broad interval between pulses (with a small clock frequency) is employed as the clock pulse CLK applied to the charge pump circuits CP. Operating the charge pump circuits CP based on the clock pulse CLK_1 to continuously repeat a boost operation until the voltage value Vpgm is obtained allows blunted waveforms such as waveforms A and B to be generated.

On the other hand, when obtaining waveforms such as waveforms C and D which have a steep rising edge, a c lock pulse CLK_2 having a waveform with a narrow interval between pulses (with a large clock frequency) is employed as the clock pulse CLK applied to the charge pump circuits CP. Operating the charge pump circuits CP based on the clock pulse CLK_2 to continuously repeat a boost operation until the voltage value Vpgm is obtained allows waveforms having a steep rising edge such as waveforms C and D to be generated.

That is, blunted waveforms such as waveform A or waveform B may be generated without decreasing the number of charge pump circuits CP. Therefore, the present invention may be configured so as to be unaffected by dispersion of characteristics of transistors configuring each of the charge pump circuits or by dispersion of characteristics of transistors for cutting off voltage supplied from the charge pumps. As a result, controllability of waveforms A through D can be improved, thereby allowing these waveforms to be stabilized.

Figure 15:
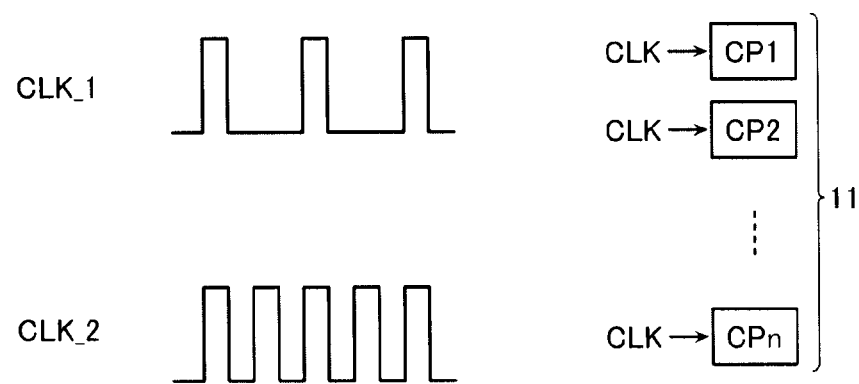
FIG. 15 is a view showing operation of a modified example of an embodiment of the present invention.

This method of generating waveforms shown in FIG. 15 may also be applied to the first through sixth embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device comprising:

a memory cell array having electrically rewritable nonvolatile memory cells arranged therein; and a control unit configured to perform control of repeating a write operation, a write verify operation, and a step-up operation, the write operation being an operation to apply a write pulse voltage to a selected one of the memory cells for data write, the write verify operation being an operation to verify whether data write is completed or not, and the step-up operation being an operation to raise the write pulse voltage by an amount of a step-up voltage if data write is not completed, the control unit being configured to, during the write operation, raise a first write pulse voltage with a first gradient, and then raise a second write pulse voltage with a second gradient, thereby executing the write operation, the first write pulse voltage including at least a write pulse voltage generated at first, the second write pulse voltage being generated after the first write pulse voltage, and the second gradient being larger than the first gradient, wherein the control unit is configured to perform voltage control such that a relation of $Wp/3 \leq t$ is satisfied, where $Wp$ is a pulse width of the first write pulse voltage, and $t$ is a width of a portion of a rise curve of the first write pulse voltage until the first write pulse voltage reaches a value.

2. The nonvolatile semiconductor memory device according to claim 1, further comprising:

a voltage generating circuit including: N ($N \geq 2$) charge pump circuits, the charge pump circuits being configured to generate a boost voltage; and a pulse generating circuit configured to generate the first write pulse voltage and the second write pulse voltage using the boost voltage, wherein the control unit is configured to drive M ($M<N$) of the charge pump circuits when generating the first write pulse voltage, and drive L ($N \geq L > M$) of the charge pump circuits when generating the second write pulse voltage.

3. The nonvolatile semiconductor memory device according to claim 1, further comprising:

a voltage generating circuit including: a boost circuit configured to generate a boost voltage; and a pulse generating circuit configured to generate the first write pulse voltage and the second write pulse voltage using the boost voltage, wherein the control unit is configured to drive the boost circuit based on a first clock pulse signal when generating the first write pulse voltage, and drive the boost circuit based on a second clock pulse signal when generating the second write pulse voltage, the first clock pulse signal having a first clock frequency, and the second clock pulse signal having a second clock frequency, the second clock frequency being higher than the first clock frequency.

4. The nonvolatile semiconductor memory device according to claim 1, wherein the control unit is configured to perform control of:

applying an intermediate voltage to unselected memory cells during the write operation, the intermediate voltage having a voltage value smaller than the write pulse voltage; and, during the write operation, raising a first intermediate voltage with a third gradient, and then raising a second intermediate voltage with a fourth gradient, the first intermediate voltage including at least an intermediate voltage generated at first, the second intermediate voltage being generated after the first intermediate voltage, and the fourth gradient being larger than the third gradient.

5. The nonvolatile semiconductor memory device according to claim 1, wherein the control unit is configured to, after a first number of the write operation, shift to the step-up operation and a next write operation without executing the write verify operation.

6. The nonvolatile semiconductor memory device according to claim 1, wherein the control unit is configured to perform voltage control such that a rise time to reach a first voltage for the first write pulse voltage is longer than that for the second write pulse voltage.

7. A nonvolatile semiconductor memory device comprising:

a memory cell array having electrically rewritable nonvolatile memory cells arranged therein;

a control unit configured to perform control of repeating a write operation, a write verify operation, and a step-up operation, the write operation being an operation to apply a write pulse voltage to a selected one of the memory cells for data write, the write verify operation being an operation to verify whether data write is completed or not, and the step-up operation being an operation to raise the write pulse voltage by an amount of a step-up voltage if data write is not completed; and a voltage generating circuit, the control unit being configured to perform voltage control such that, during the write operation, a rise time to reach a first voltage for a first write pulse voltage is longer than that for a second write pulse voltage, the first write pulse voltage including at least a write pulse voltage generated at first, and the second write pulse voltage being generated after the first write pulse voltage, the voltage generating circuit including: N ($N \geq 2$) charge pump circuits, the charge pump circuits being configured to generate a boost voltage, and a pulse generating circuit configured to generate the first write pulse voltage and the second write pulse voltage using the boost voltage, and the control unit being configured to drive M ($M<N$) of the charge pump circuits when generating the first write pulse voltage, and drive L ($N \geq L > M$) of the charge pump circuits when generating the second write pulse voltage.

8. The nonvolatile semiconductor memory device according to claim 7, wherein the control unit is configured to drive the charge pump circuits based on a first clock pulse signal when generating the first write pulse voltage, and drive the charge pump circuits based on a second clock pulse signal when generating the second write pulse voltage, the first clock pulse signal having a first clock frequency, and the second clock pulse signal having a second clock frequency, the second clock frequency being higher than the first clock frequency.

9. The nonvolatile semiconductor memory device according to claim 7, wherein
the control unit is configured to perform control of:
applying an intermediate voltage to unselected memory cells during the write operation, the intermediate voltage having a voltage value smaller than the write pulse voltage; and,
during the write operation, raising a first intermediate voltage with a third gradient, and then raising a second intermediate voltage with a fourth gradient, the first intermediate voltage including at least an intermediate voltage generated at first, the second intermediate voltage being generated after the first intermediate voltage, and the fourth gradient being larger than the third gradient.

10. The nonvolatile semiconductor memory device according to claim 7, wherein
the control unit is configured to, after a first number of the write operation, shift to the step-up operation and a next write operation without executing the write verify operation.

11. The nonvolatile semiconductor memory device according to claim 7, wherein
a pulse width of the first write pulse voltage is larger than a pulse width of the second write pulse voltage.

12. A nonvolatile semiconductor memory device comprising:
a memory cell array having electrically rewritable nonvolatile memory cells arranged therein; and
a control unit configured to perform control of repeating a write operation, a write verify operation, and a step-up operation, the write operation being an operation to apply a write pulse voltage to a selected one of the memory cells for data write, the write verify operation being an operation to verify whether data write is completed or not, and the step-up operation being an operation to raise the write pulse voltage by an amount of a step-up voltage if data write is not completed,
the control unit being configured to perform voltage control such that, during the write operation, a relation of Wp/3≤t is satisfied, where Wp is a pulse width of a first write pulse voltage, and t is a width of a portion of a rise curve of the first write pulse voltage until the first write pulse voltage reaches a value, the first write pulse voltage including at least a write pulse voltage generated at first.

13. The nonvolatile semiconductor memory device according to claim 12, wherein
the control unit is configured to perform voltage control such that a rise time to reach a first voltage for the first write pulse voltage is longer than that for a second write pulse voltage, the second write pulse voltage being generated after the first write pulse voltage.

14. The nonvolatile semiconductor memory device according to claim 13, further comprising:
a voltage generating circuit including: N (N≥2) charge pump circuits, the charge pump circuits being configured to generate a boost voltage; and a pulse generating circuit configured to generate the first write pulse voltage and the second write pulse voltage using the boost voltage,
wherein the control unit is configured to drive M (M<N) of the charge pump circuits when generating the first write pulse voltage, and drive L (N≥L>M) of the charge pump circuits when generating the second write pulse voltage.

15. The nonvolatile semiconductor memory device according to claim 13, further comprising:
a voltage generating circuit including: a boost circuit configured to generate a boost voltage; and a pulse generating circuit configured to generate the write pulse voltage using the boost voltage,
wherein the control unit is configured to drive the boost circuit based on a first clock pulse signal when generating the first write pulse voltage, and drive the boost circuit based on a second clock pulse signal when generating the second write pulse voltage, the first clock pulse signal having a first clock frequency, and the second clock pulse signal having a second clock frequency, the second clock frequency being higher than the first clock frequency.

16. The nonvolatile semiconductor memory device according to claim 12, wherein
the control unit is configured to perform control of:
applying an intermediate voltage to unselected memory cells during the write operation, the intermediate voltage having a voltage value smaller than the write pulse voltage; and,
during the write operation, raising a first intermediate voltage with a third gradient, and then raising a second intermediate voltage with a fourth gradient, the first intermediate voltage including at least an intermediate voltage generated at first, the second intermediate voltage being generated after the first intermediate voltage, and the fourth gradient being larger than the third gradient.

17. The nonvolatile semiconductor memory device according to claim 12, wherein
the control unit is configured to, after a first number of the write operation, shift to the step-up operation and a next write operation without executing the write verify operation.

18. The nonvolatile semiconductor memory device according to claim 13, wherein
a pulse width of the first write pulse voltage is larger than a pulse width of the second write pulse voltage.

* * * * *